United States Patent
Shingo (10) Patent No.: US 7,352,620 B2
(45) Date of Patent: Apr. 1, 2008

(54) NON-VOLATILE SEMICONDUCTOR DEVICE AND METHOD FOR AUTOMATICALLY RECOVERING ERASE FAILURE IN THE DEVICE

(75) Inventor: Masaki Shingo, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 17 days.

(21) Appl. No.: 11/110,220

(22) Filed: Apr. 20, 2005

(65) Prior Publication Data

US 2006/0239111 A1    Oct. 26, 2006

Related U.S. Application Data

(63) Continuation of application No. PCT/JP2004/005680, filed on Apr. 21, 2004.

(51) Int. Cl.
*G11C 16/06* (2006.01)
(52) U.S. Cl. ............ 365/185.09; 365/185.11; 365/185.22; 365/185.29
(58) Field of Classification Search ......... 365/185.09, 365/185.11, 185.22, 185.29
See application file for complete search history.

(56) References Cited

U.S. PATENT DOCUMENTS

| 5,168,465 | A | * | 12/1992 | Harari | 257/320 |
| 5,347,484 | A | * | 9/1994 | Kwong et al. | 365/49 |
| 5,396,468 | A | * | 3/1995 | Harari et al. | 365/218 |
| 5,579,265 | A | * | 11/1996 | Devin | 365/200 |
| 5,774,396 | A | * | 6/1998 | Lee et al. | 365/185.09 |
| 5,847,995 | A | * | 12/1998 | Kobayashi et al. | 365/185.18 |
| 5,930,169 | A | * | 7/1999 | Iwata et al. | 365/185.09 |
| 5,994,732 | A | * | 11/1999 | Ajika et al. | 257/315 |
| 6,327,180 | B2 | * | 12/2001 | Taura et al. | 365/185.09 |
| 6,385,090 | B1 | * | 5/2002 | Kitazaki | 365/185.18 |
| 6,778,443 | B2 | * | 8/2004 | Shiga et al. | 365/185.33 |
| 6,928,002 | B2 | * | 8/2005 | Shiga et al. | 365/185.33 |
| 6,944,072 | B2 | * | 9/2005 | Micheloni et al. | 365/200 |
| 2004/0015674 | A1 | * | 1/2004 | Lakhani et al. | 711/206 |
| 2005/0204212 | A1 | * | 9/2005 | Noguchi et al. | 714/710 |

FOREIGN PATENT DOCUMENTS

| JP | 8-7597 A | 1/1996 |
| JP | 9-91977 A | 4/1997 |
| JP | 2001-195892 A | 7/2001 |
| JP | 2002-170389 A | 6/2002 |
| JP | 2002-313087 A | 10/2002 |

* cited by examiner

*Primary Examiner*—Hoai V. Ho (57) ABSTRACT

A spare sector is in a blank state beforehand. Each time the erasing is carried out in practical use, the number of erase pulses is counted or the presence/absence of overcurrent flowing when the erase pulse is being applied is monitored. A regular sector having long-erase failure thus detected is automatically replaced with a spare sector. In this manner, the long-erase failure can be recovered without erasing the spare sector after automatic redundancy with the spare sector.

20 Claims, 11 Drawing Sheets

TURN ON WITH $V_G$ BECAUSE OF ERASED STATE
(ALLOW CURRENT TO FLOW)

CAM-A0

FIG.3B

DOES NOT TURN ON WITH $V_G$ BECAUSE OF PROGRAMMED STATE
(DOES NOT ALLOW CURRENT TO FLOW)

CAM-A1

NON-VOLATILE SEMICONDUCTOR DEVICE AND METHOD FOR AUTOMATICALLY RECOVERING ERASE FAILURE IN THE DEVICE

CROSS REFERENCE TO RELATED APPLICATION

This is a continuation of International Application No. PCT/JP2004/005680, filed Apr. 21, 2004.

BACKGROUND OF THE INVENTION

1. Field of the Invention

The present invention relates to a non-volatile semiconductor device and a method for automatically recovering an erase failure, and more particularly, to a semiconductor device capable of automatically and quickly recovering an erase failure in which data in a sector cannot be erased within a given time (long-erase failure) and a method of automatically recovering a long-erase failure.

2. Description of the Related Art

A flash memory is known as one of the non-volatile semiconductor devices. The flash memory has sectors each of which is a group of core cells. The conventional flash memory is equipped with a redundant circuit having a redundant sector (spare sector) that is separate from regular sectors (normal sectors) and is provided on the same chip in order to save the device from a failure in any of the regular sectors. A defective regular sector identified by the test/inspection in the fabrication process is replaced by the spare sector. If a long-erase failure occurs in the flash memory chip involved in practical use after shipping, the chip is a "long-erase failure" chip and is handled as a defective chip. If an erase failure is detected by the chip test/inspection step prior to shipping, it may be replaced by a spare sector or the defective chip is discarded by screening.

However, it is eventually difficult to completely implement redundancy and screening for erase failures, and it is inevitable to have an erase failure in practical use after shipping. Japanese Patent Application Publication No. 8-7597 discloses a non-volatile semiconductor memory device enabling automatic recovery from a failure that occurs in practical use by end users. This device is equipped with a circuit that prevents a memory cell having degraded programming or erasing performance from being selected in practical use in order to ensure the good memory performance.

However, the device disclosed in Japanese Patent Application Publication No. 8-7597 erases the sector specified by automatic redundancy, and admits of improvement in reduction of the time necessary for automatic recovery from sector failure.

SUMMARY OF THE INVENTION

The present invention has been made taking the above problems into consideration and has an object of providing a semiconductor device capable of automatically and quickly recovering erase failure in which data stored in a sector cannot be erased within a given time (long-erase failure) and presenting to the users the environment substantially equal to that having no long-erase failure, and a method for automatic recovery from long-erase failure.

In order to achieve the above objective, the present invention is a semiconductor device comprising: electrically erasable/programmable regular sectors; at least one electrically erasable/programmable spare sector for the regular sectors; a decoder selecting one of the regular sectors in response to an erase command; a monitor circuit monitoring an erase performance of a selected regular sector during erasing; and a control circuit automatically selecting the spare sector for the selected regular sector when the selected regular sector has a degraded erase performance, the spare sector being initially in an erased state prior to selecting by the control circuit.

Preferably, the control circuit automatically selects the spare sector when the erase performance of the selected regular sector shows that erasing thereof is incomplete within a given period of time.

The monitor circuit may be configured so as to include a pulse counter that counts pulses for erasing, and monitors the erase performance of the selected regular sector on the basis of a number of pulses counted. In this case, the control circuit may be configured so as to verify erasing and automatically selects the spare sector when verification of erasing still fails at a given number of pulses counted.

The monitor circuit may be configured so as to include a current detector that detects a leakage current flowing in the selected regular sector during erasing. In this case, the control circuit may be configured so as to automatically select the spare sector when the leakage current reaches a given amount of current during erasing. The leakage current may be a flowing between a word line and a well of the selected regular sector during erasing.

The control circuit may be configured so as to include a content addressable memory (CAM) storing an address of the selected regular sector that has the degraded erase performance.

The control circuit may be configured so as to include: a content addressable memory (CAM) storing an address of the selected regular sector that has the degraded erase performance; and an address compare circuit that compares an address indicated by the erase command with the address stored in the CAM and causes the decoder to select the spare sector when the address indicated by the erase command coincides with the address in the CAM.

The control circuit may be configured so as to verify erasing of the selected regular sector and generates a signal that sets the selected regular sector in a programmable state when verification passes.

The control circuit may be configured so as to continue to verify erasing of the selected regular sector until a predetermined maximum number of pulses for erasing is applied thereto if the control circuit fails to automatically select the spare sector. The CAM may include a non-volatile memory cell that stores the address of the selected regular sector.

The present invention is a redundant method for a non-volatile semiconductor memory comprising the steps of: erasing data stored in a regular sector selected by an erase command; monitoring an erase performance of a selected regular sector; and selecting a spare sector for the selected regular sector when the selected regular sector has a degraded erase performance, the spare sector being initially in an erased state prior to the step of selecting.

Preferably, the step of selecting automatically selects the spare sector when the erase performance of the selected regular sector shows that erasing thereof is incomplete within a given period of time.

The step of selecting may be configured so as to include a step of counting pulses for erasing in order to monitor the erase performance of the selected regular sector on the basis of a number of pulses counted.

The step of monitoring may be configured so as to include a step of detecting a leakage current flowing in the selected regular sector during erasing.

The step of monitoring may be configured so as to include a step of detecting a leakage current flowing between a word line and a well of the selected sector during erasing.

The redundant method may further include a step of storing an address of the selected regular sector that has the degraded erase performance.

The redundant method may further include the steps of: storing an address of the selected regular sector that has the degraded erase performance; and comparing an address indicated by the erase command with the address stored and selecting the spare sector when the address indicated by the erase command coincides with the address stored.

In the non-volatile semiconductor memory, all data in the spare sector are erased so that the spare sector is in the erased (blank) state at the final state prior to shipping. Each time erasing is carried out by the user, the number of erase pulses is counted or current flowing between the word line to which the erase pulse is applied and the P-well is monitored within the memory. The automatic switching to the spare sector is completed before the occurrence of long-erase failure is acknowledged. Thus, it is possible to recover the long-erase failure before the occurrence of long-erase failure is acknowledged without erasing the spare sector after the automatic redundancy with the spare sector.

Even when the command for erasing the defective sector is input after the automatic recovery, it is determined whether the address of the sector specified by the input command and the defective sector address match each other. The defective sector specified by the command is not selected but the spare sector is automatically selected.

Thus, the user feels as if long-erase failure in the regular sectors does not occur at all, and is provided with the normal environment in which erasing is normally completed. The spare sector or sectors are in the erased (blank) state at the time of shipping. Thus, the automatic redundancy with the spare sector does not need to erase the spare sector again after the replacement, and erasing can be completed quickly.

According to the present invention, it is possible to provide providing a semiconductor device capable of automatically and quickly recovering erase failure in which data stored in a sector cannot be erased within a given time (long-erase failure) and presenting to the users the environment substantially equal to that having no long-erase failure, and a method for automatic recovery from long-erase failure.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention with reference to the accompanying drawings.

First Embodiment

Figure 1:
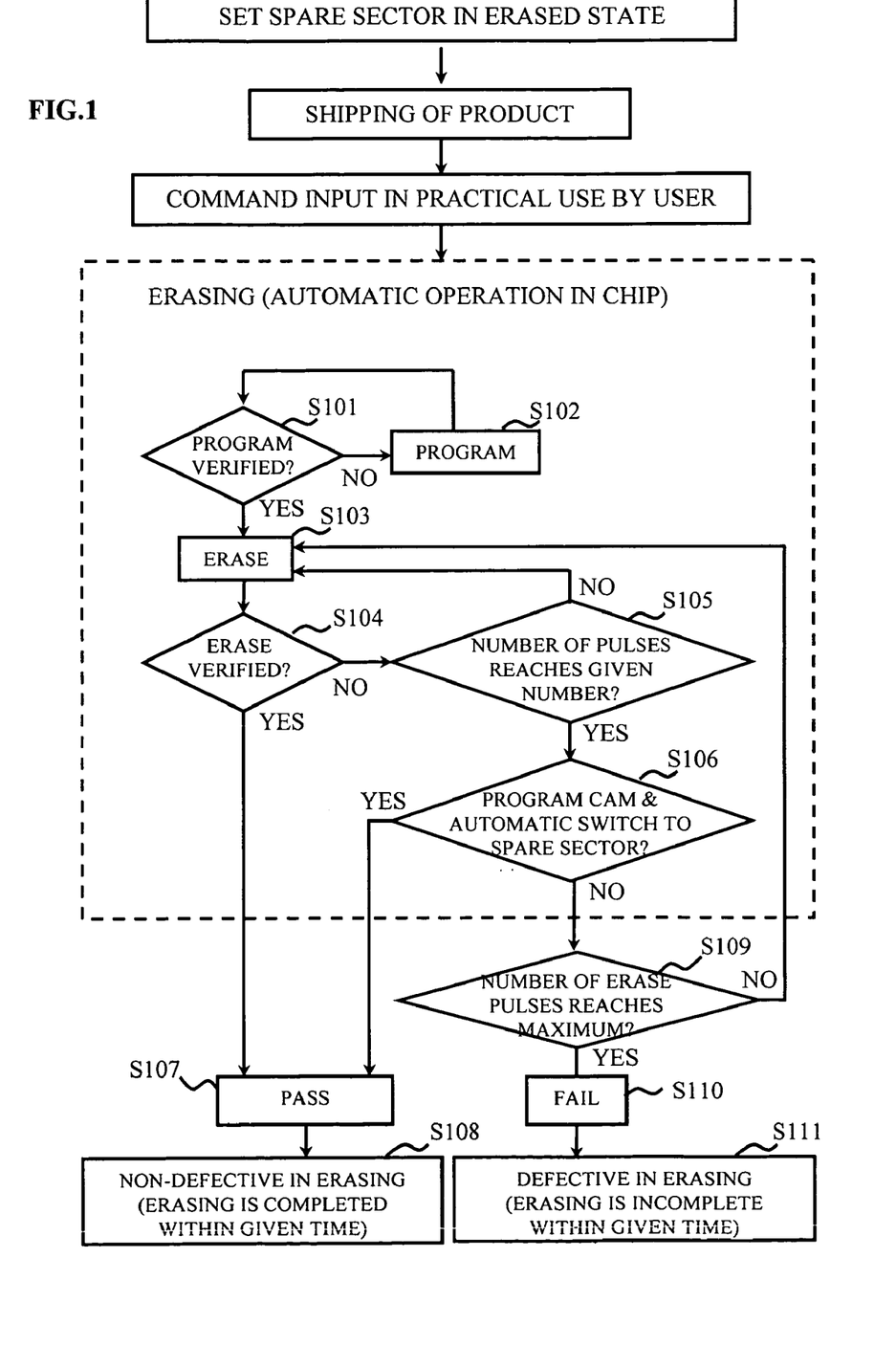
FIG. 1 is a flowchart of a first sequence of a long-erase failure recovery operation executed by a non-volatile semiconductor memory of the present invention.

FIG. 1 is a flowchart of a first sequence of an automatic recovery from long-erase failure executable in a non-volatile semiconductor memory of the present invention. The circuit for the automatic recovery is provided on the chip on which the memory part of the non-volatile semiconductor memory according to this embodiment, and is capable of automatically recovering long-erase failure.

The memory part of the non-volatile semiconductor memory is the same as that of the conventional memory. Therefore, the following description is directed to the configuration of the circuit that executes the long-erase failure recovery operation.

The non-volatile semiconductor memory is equipped with "regular sectors" that are normally provided and a "spare sector" that is a redundant sector. The spare sector is set in the erased (blank) state at the stage of the final test/inspection before shipping. Thus, the spare sector is in the blank state when the non-volatile semiconductor memory is placed in practical use and is subjected to data erase for the first time. The spare sector may be selected rather than a regular sector that has a long-erase failure when a "defective sector address" stored in an automatic redundancy CAM coincides with an "erase command input address", and the same configuration as the regular sectors.

The memory of the present embodiment executes a sequence of automatically determining whether data has been normally erased within the given time of the regular sector selected and replacing the selected regular sector by the spare sector if it is determined that the regular sector has "long-erase failure". This sequence will now be described with reference to FIG. 1.

The following operation is carried out when a command (erase command) for erasing data in data stored in one of the regular sectors is applied by the user.

First, it is determined whether a regular sector is in the programmed state (step S101). When the regular sector is not in the programmed state (No in step S101), the regular sector is programmed and set in the programmed state (step S102).

When it is confirmed that the regular sector is in the programmed state (YES in step S101), the regular sector is subjected to erasing within a given time (Δt) (step S103), and it is determined whether the regular sector has fallen in the erased state (step S104).

When it is determined that the regular sector is in the erased state (YES in step S104), erasing of the present regular sector is completed (step S107), and the memory is handled as a non-defective memory (step S108).

In contrast, if the regular sector is not in the erased state (NO in step S104), it is determined whether the number (n) of erase pulses, which correspond to the number of times of erasing, has reached a predetermined number in order to determine whether the total time of erasing (step S103) is less than the given time (t) for making a decision of "long-erase failure" (step S105).

When the number (n) of erase pulses does not reach the predetermined number (NO in step S105), the total time (n·Δt) spent for the erasing of the regular sector has not yet reached the predetermined time (t) for making a decision of long-erase failure (n·Δt<t). Thus, further erasing is carried out (step S103) so that the sequence of steps S103-S105 is repeatedly performed.

When the number (n) of erase pulses reaches the predetermined number (YES in step S105), the total time (n·Δt) spent for the erasing of the regular sector has reached the predetermined time (t) for making a decision of long-erase failure (n·Δt≧t). The step of replacing the regular sector by the spare sector is carried out.

More specifically, the address of the regular sector judged as long-erase failure is written in the automatic redundancy CAM of the memory as "defective sector address". This allows the defective sector to be automatically replaced with the spare sector (step S106).

When the replacement with the spare sector is completed (YES in step S106), the erasing carried out in response to the erase command directed to the regular sector is completed (step S107), and the memory is handled as "non-defective memory" (step S108).

In contrast, if the automatic replacement with the spare sector is not completed due to a situation such that the spare sector in the blank state is not available (NO in step S106), it is determined whether the number of erase pulses has reached the predetermined maximum value (step S109). If the number of erases pulses has reached the maximum value (YES in step S109), the erasing of the involved normal sector cannot be completed (step S110), and the memory is handled as "defective memory" (step S111). If the number of erase pulses has not yet reached the maximum value (NO in step S109), the process returns to step S103, and the following sequence is carried out.

The reason why the maximum number of erase pulses is used in step S109 is that a long-erase failure may be recovered by supplementary erasing in addition to the erasing amounting to the given number of erase pulses used in step S105. If there is no need to consider the above-mentioned type of recovery of the long-erase failure, the maximum number used in step S109 may be set equal to the given number of erase pulses used in step S105, so that the process of step S109 can be substantially invalidated.

Figure 2:
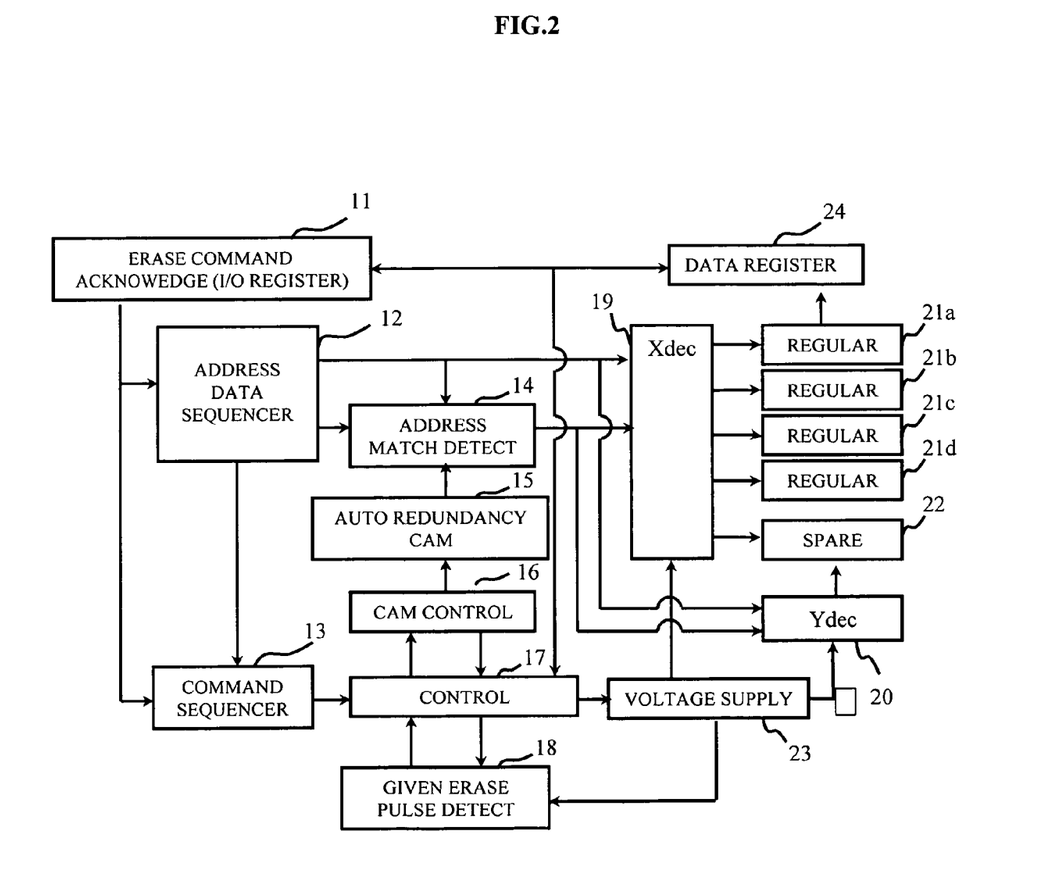
FIG. 2 is a block diagram of an outline of a first configuration of an automatic recovery section of the non-volatile semiconductor memory of the present invention that executes the sequence shown in FIG. 1.

FIG. 2 is a bock diagram of an outline of the configuration of an automatic recovery section provided in the non-volatile memory of the present invention that executes the sequence shown in FIG. 1.

The memory is equipped with a given erase pulse detection circuit 18, a CAM control circuit 16, and a control circuit 17 in order to implement automatic replacement in which a regular sector having "long-erase failure" in which the erasing thereof is not completed within the given time is identified and is replaced with the spare sector. The given erase pulse detection circuit 18 determines whether the total time of erasing of the regular sector is less than the given time for making a decision of long-erase failure. The CAM control circuit 16 controls an automatic redundancy CAM 15. The control circuit 17 controls the CAM control circuit 16 based on a detection signal from the given erase pulse detection circuit 18 and generates a signal for replacement with the spare sector. The given erase pulse detection circuit 18 is one embodiment of an erase performance detection circuit.

The erase command given by the user is acknowledged by an erase command acknowledgement unit 11 equipped with an I/O register and a buffer. An address command signal that is included in the erase command and is indicative of a sector to be erased is output to an address data/sequencer 12, and an erase command signal included in the erase command is output to a command sequencer 13.

An address match detection circuit 14 makes a decision as to whether address data about the sector to be erased in the address data/sequencer 12 and the address data about the defective sector stored in the automatic redundancy CAM 15 programmed with the address of the defective sector match each other. If the address of the regular sector specified by the erase command coincides with the address of the sector having the long-erase failure, the address match detection circuit 14 cancels selection of the specified regular sector and executes automatic switching to the spare sector.

The memory has a group of sectors that consist of regular sectors 21 (21a-21d in the present embodiment) and a spare sector 22 serving as a redundant sector. Each of the sectors has an array of flash memory cells, which may, for example, be of NOR type having a floating gate and a control gate. A word line is connected to control gates of cells in the same sector, and a bit line is connected to drains of the cells in the same column. The word lines and bit lines are connected to an X decoder (Xdec) 19 and a Y decoder (Ydec) 20.

The X decoder 19 selectively drives the word line corresponding to the addresses given by the address data/sequencer 12 and the address match detection circuit 14 on the basis of a signal supplied from a voltage supply circuit 23. The X decoder 19 is equipped with a decoder for decoding the input address signals and a word line driver for applying a given voltage to the word lines.

Similarly, the Y decoder 20 selectively drives the bit line corresponding to the address from the address data/sequencer 12 and the address match detection circuit 14 on the basis of a signal supplied from the voltage supply circuit 23, and is equipped with a decoder for decoding the input address signals and a bit line driver for applying a given voltage to the bit lines.

The signal that indicates the state (erased/programmed state) of each sector is output to and stored in a data register 24, and is further fed back to the control circuit 17. Replacement of a regular sector judged as erase failure with the spare sector in the blank state is executed through the voltage supply circuit 23 driven by a control signal supplied from the control circuit 17.

The address data/sequencer 12 acknowledges the regular sector to be erased and stores its address data, which is output to the command sequencer 13.

The command sequencer 13 supplies the control circuit 17 with a signal for erasing the regular sector based on the erase command from the erase command acknowledgement unit 11 and the address data from the address data/sequencer 12.

The control circuit 17 outputs a program verify signal to the voltage supply circuit 23 in order to determine whether the regular sector to be erased is in the erased or programmed state. The voltage supply circuit 23 supplied with the program verify signal determines whether the regular sector is in the erased or programmed state through the X decoder 19 and the Y decoder 20.

The result of determining whether the regular sector is in the erased or programmed state is output to the data register 24. The control circuit 17 is supplied with the signal stored in the data register 24 if the regular sector is not in the programmed state, and writes data into the regular sector via the voltage supply circuit 23, so that the regular sector can be in the programmed state.

In contrast, when it is confirmed that the regular sector is in the programmed state, information indicative thereof is output to the control circuit 17 from the data register 24, the voltage supply circuit 23 outputs a signal for erasing the regular sector within the given time ($\Delta t$) to the X decoder 19 and the Y decoder 20, so that erasing is executed.

The control circuit 17 determines the status of erasing the regular sector by the same process as the above-mentioned process of confirming the erased/programmed state, and outputs the results of this determination to the data register 24.

When it is determined that the regular sector is in the erased state, the result of this determination is output to the control circuit 17, and the erasing is completed. Thus, the memory is judged as non-defective memory and the sequence is ended.

In contrast, if the regular sector is not in the erased state, a signal for erasing the program stored in the regular sector again within the given time ($\Delta t$) is output by the voltage control circuit 23 and is applied to the X decoder 19 and the Y decoder 20, so that erasing is performed. The erasing is repeatedly carried out until the number of erase pulses equal to the number of times of erasing reaches the predetermined number.

The given erase pulse detection circuit 18 detects the erase pulse output by the voltage supply circuit 23, and counts the number of erase pulses supplied to the regular sector to be erased. Then, the circuit 18 outputs the number of erase pulses thus counted to the control circuit 17.

It takes time $\Delta t$ to complete erasing all at once. The product ($n \cdot \Delta t$) of the time $\Delta t$ and the number (n) of times of erasing counted by the given erase pulse detection circuit 18 is computed, and it is determined whether the product is less than the given time (t) for making a decision of long-erase failure. In practice, the control circuit 17 determines whether the number (n) of erase pulses from the given erase pulse detection circuit 18 reaches the given number.

If the number (n) of erase pulses does not reach the given number, the total time ($n \cdot \Delta t$) spent for erasing has not reached the given time (t) for making a decision of long-erase failure ($n \cdot \Delta t < t$), and erasing is further repeatedly carried out.

In contrast, when the number (n) of erase pulses reaches the given number, the total time ($n \cdot \Delta t$) spent for erasing has reached the given time (t) for making a decision of long-erase failure ($n \cdot \Delta t \geq t$). Thus, the regular sector involved in erasing is replaced by the spare sector by the sequence that will be described below.

The replacement of the regular sector by the spare sector is carried out as follows. The control circuit 17 that determines that the regular sector should be replaced by the spare sector supplies the CAM control circuit 16 with an instruction signal for storing "defective sector address" in the automatic redundancy CAM 15. In response to the instruction signal, the automatic redundancy CAM 15 is programmed with the defective sector address, and the result of programming is output to the address match detection circuit 14.

The address match detection circuit 14 determines whether the address of the regular sector to be erased stored in the address data/sequencer 12 and the defective sector address stored in the automatic redundancy CAM 15 match each other. If the address of the regular sector specified by the erase command matches the address of the defective sector of long-erase failure, the address match detection circuit 14 supplies the X decoder 19 and the Y decoder 20 with the signals for canceling selection of the regular sector and automatic switching to the spare sector. In this manner, the regular sector of the long-erase failure can be automatically replaced by the spare sector 22 in the blank state.

When the automatic replacement with the spare sector is completed, the process associated with the erase command is completed, and the memory is maintained in the non-defective state. In contrast, if the automatic replacement with the spare sector is incomplete due to, for example, a situation in which a spare sector in the blank state is not available, the memory fails to recover the defective sector and is judged as a defective memory of long-erase failure.

Although FIG. 2 shows four rows of regular sectors and one row of spare sector, it will be apparent that an arbitrary number of rows of sectors can be employed. A larger number of times of replacement will need a larger number of spare sectors in the blank state.

A description will now be given of the structures and operations of the automatic redundancy CAM, the address match detection circuit, and the circuit for programming the automatic redundancy CAM when erase failure is identified, and the given erase pulse detection circuit.

Figure 3A:
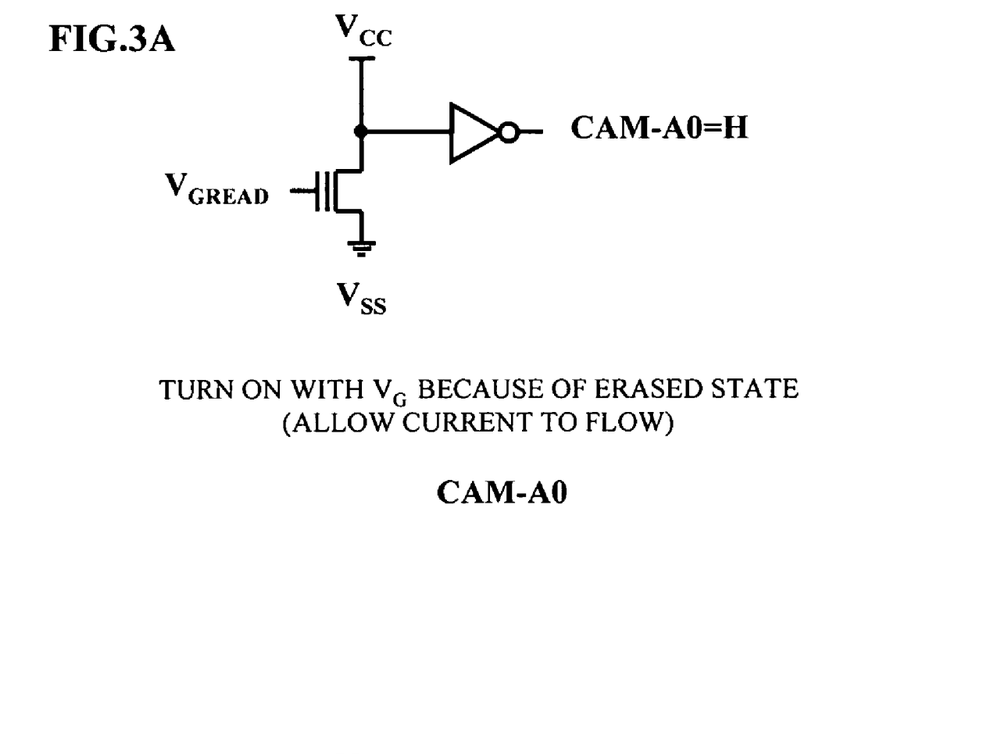
FIGS. 3A and 3B are diagrams of an operation of an automatic redundancy CAM.
Figure 3B:
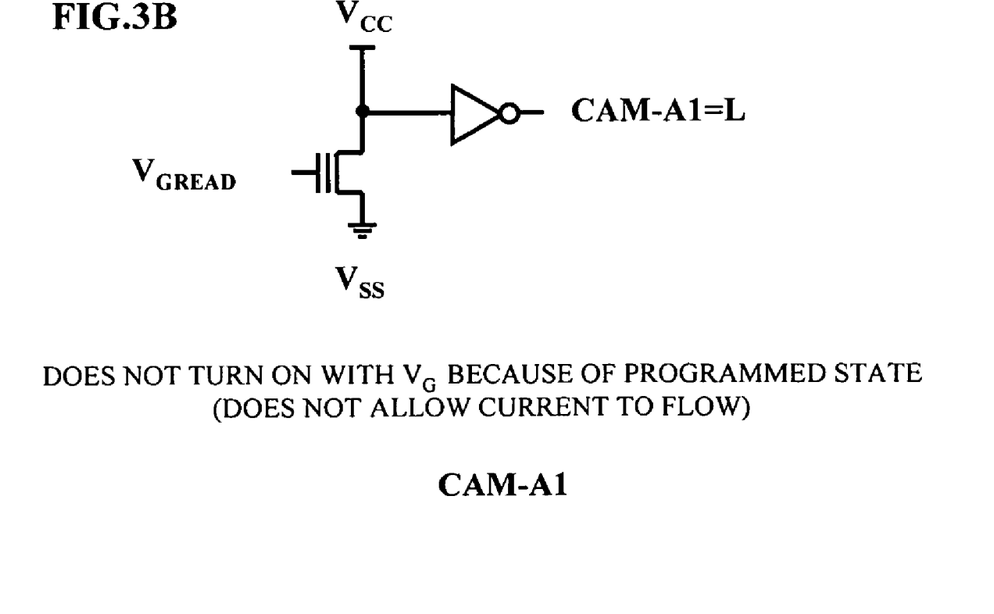

FIGS. 3A and 3B are diagrams of an operation of the automatic redundancy CAM, and show an exemplary case where address [10](CAM–A0=0(L), CAM–A1=1(H)) is stored in CAMs. These CAMs have the same structure as that of the flash memory cells, and are content addressable memories for storing the sector address of the defective regular sector judged as long-erase failure.

The CAM allows current to flow (erased state: FIG. 3A) or does not allow current to flow (programmed state: FIG. 3B) on the basis of the amount of charge stored in the floating gate thereof in response to a gate voltage $V_G$ (especially $V_{GREAD}$) applied at the time of reading. With this structure, the CAMs are capable of storing the address of any regular sector.

Figure 4:
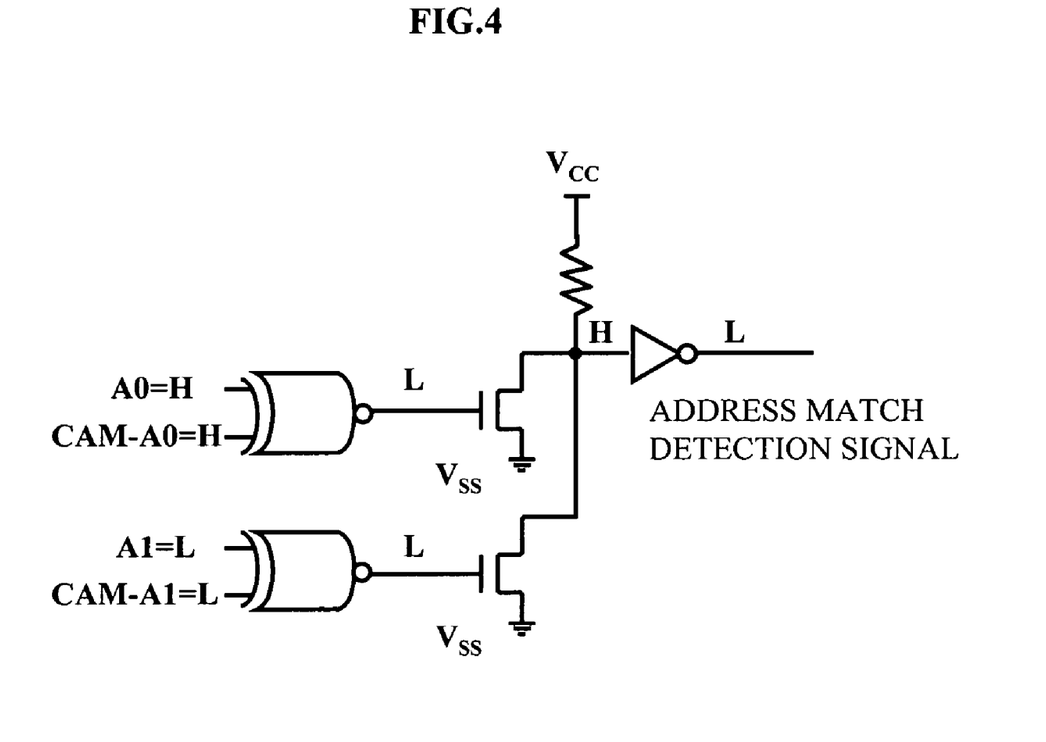
FIG. 4 is a diagram of an exemplary operation in which an address match detection signal is output from an address match detection signal.

FIG. 4 is a diagram of a configuration of a circuit section that is part of the address match detection circuit 14 and is capable of generating an address match signal. The address match detection circuit 14 includes two NOR circuits, two NMOS transistors, a resistor and an inverter. This circuit determines whether the defective sector address (CAM–A0=0(H), CAM–A1=1(L)) stored in the automatic redundancy CAM (CAM–A0 and CAM–A1) matches the address (A0=0(H), A1=1(L)) of the regular command specified by the erase command given by the user. When both the addresses match each other, the address match detection circuit 14 generates the signal that cancels the erase command specifying the regular sector having the long-erase failure and selects the normally erasable spare sector.

Figure 5:
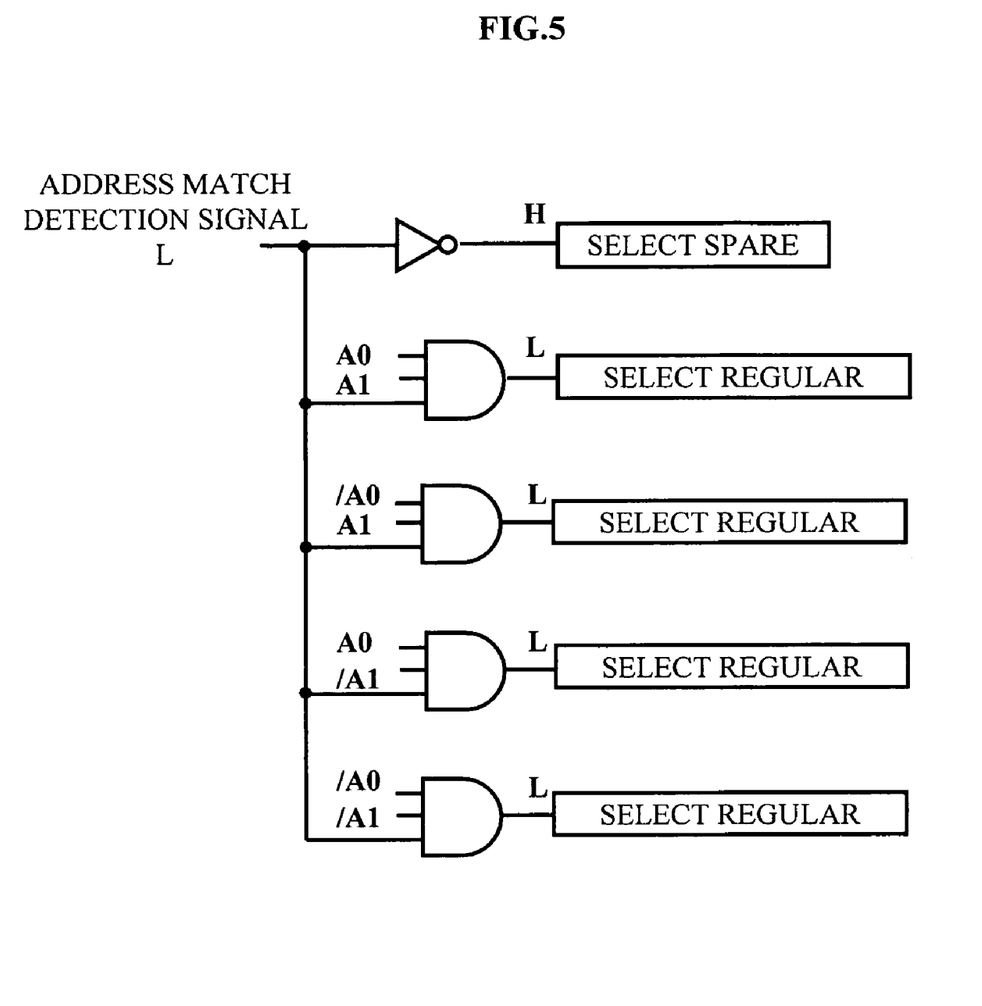
FIG. 5 is a diagram of an operation in which a spare sector is selected based on the address match detection signal (L) obtained in FIG. 4.

FIG. 5 is a diagram of a circuit section that is part of the address match detection circuit 14 and selects the spare sector responsive to the address match detection signal (L) generated by the circuit section shown in FIG. 4. Response to the address match detection signal (L), the signal for selecting the regular sector is cancelled, and the spare sector is selected (H). The address match detection signal at L level sets the outputs of four AND gates to L level, so that the regular sector cannot be selected. In contrast, the output of the inverter is at H level, and the spare sector is selected.

Figure 6:
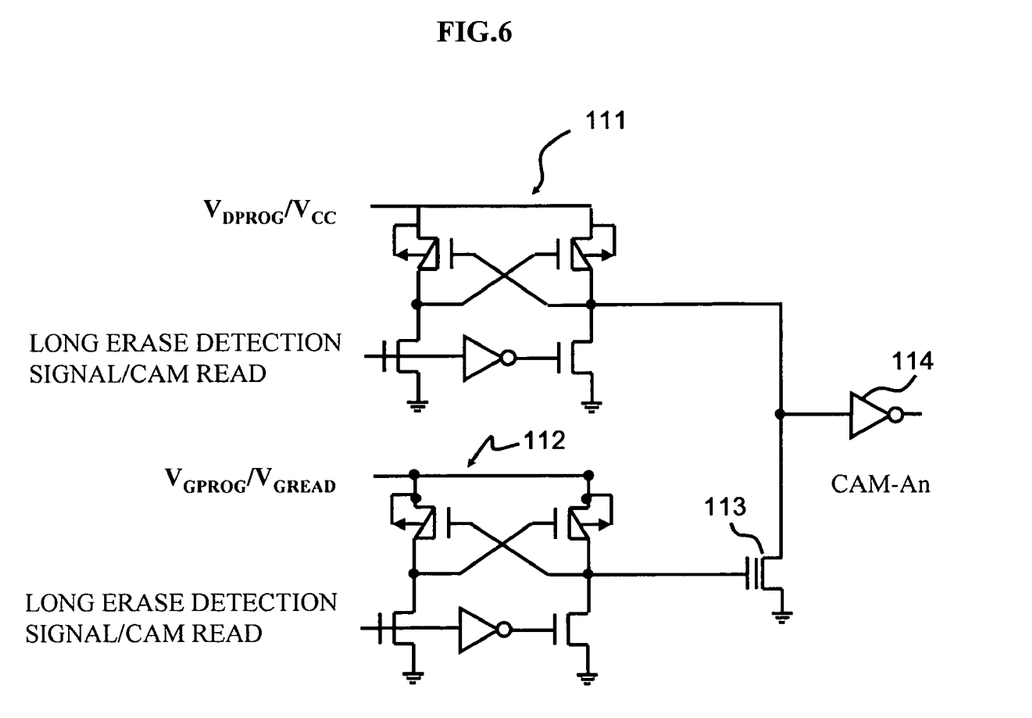
FIG. 6 is a diagram of a circuit configuration that executes programming of the automatic redundancy CAM based on a long-erase detection signal determined as erase failure.

When the regular selector is determined as erase failure, the CAM control circuit 16 programs the automatic redundancy CAM 15 responsive to the long-erase detection signal. FIG. 6 shows a circuit configuration of the CAM control circuit 16. This circuit is configured so as to have the function of electrically erasing or programming the automatic redundancy CAM 15 response to the long-erase detection signal. More specifically, the CAM control circuit 16 has two latch circuits 111 and 112, a non-volatile memory cell 113, and an inverter 114. Each of the latch circuits 111 and 112 has a flip-flop, an inverter and two NMOS transistors. When the long-erase detection signal switches to H, the latch circuits 111 and 112 output H ($VG_{PROG}$, $VG_{PROG}$), so that the non-volatile memory cell 113 is programmed. Data (address) programmed is output to the automatic redundancy CAM via the inverter 114 (CAM–An).

Figure 7A:
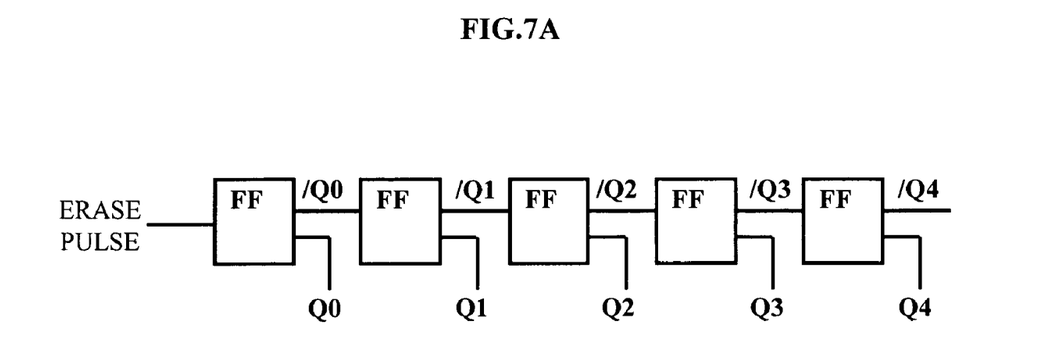
FIGS. 7A and 7B are diagrams of a configuration and operation of a given erase pulse detection circuit.
Figure 7B:
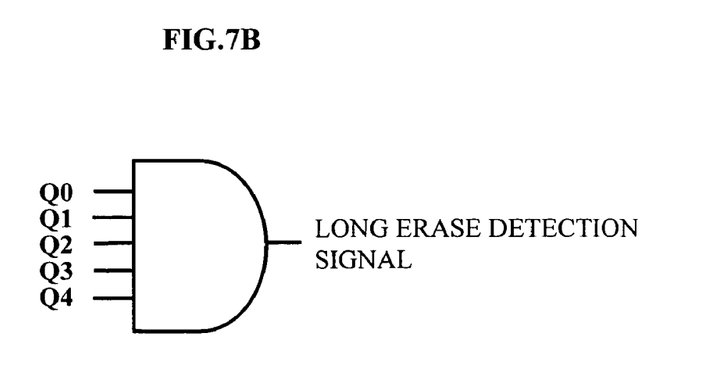

FIGS. 7A and 7B show a structure and operation of the given erase pulse detection circuit 18. In this example, as shown in FIG. 7A, the erase pulse is applied to a detection circuit composed of five flip-flop circuits (FF) connected in series, so that 32 pulses can be detected. The outputs ($Q_0$-$Q_4$) of the five FF circuits are applied to an AND gate shown in FIG. 7B, which outputs the long-erase detection signal.

As described above, the non-volatile semiconductor memory of the present invention is designed so that data in the spare sector or sectors are all erased and are set in the erased (blank) state in the final stage of the fabrication prior to shipping. Each time erasing is performed by the user, the number of erase pulses is counted in the memory and the spare sector is substituted for the regular sector before it is determined that the long-erase failure occurs in the memory.

Thus, there is no need to erase the spare sector again after automatic redundancy and the long-erase failure that occurs in user's practical use can be recovered. Even if a command of erasing the defective sector after automatic redundancy is supplied, this command directed to the defective sector is cancelled and the spare sector is instead selected based on the address matching between the sector address specified by the input command and the defective sector address. Thus, the switching to the spare sector can be automatically implemented.

Thus, the user feels as if long-erase failure in the regular sectors does not occur at all, and is provided with the normal environment in which erasing is normally completed. The spare sector or sectors are in the erased (blank) state at the time of shipping. Thus, the automatic redundancy with the spare sector does not need to erase the spare sector again after the replacement, and erasing can be completed quickly.

Second Embodiment

Figure 8:
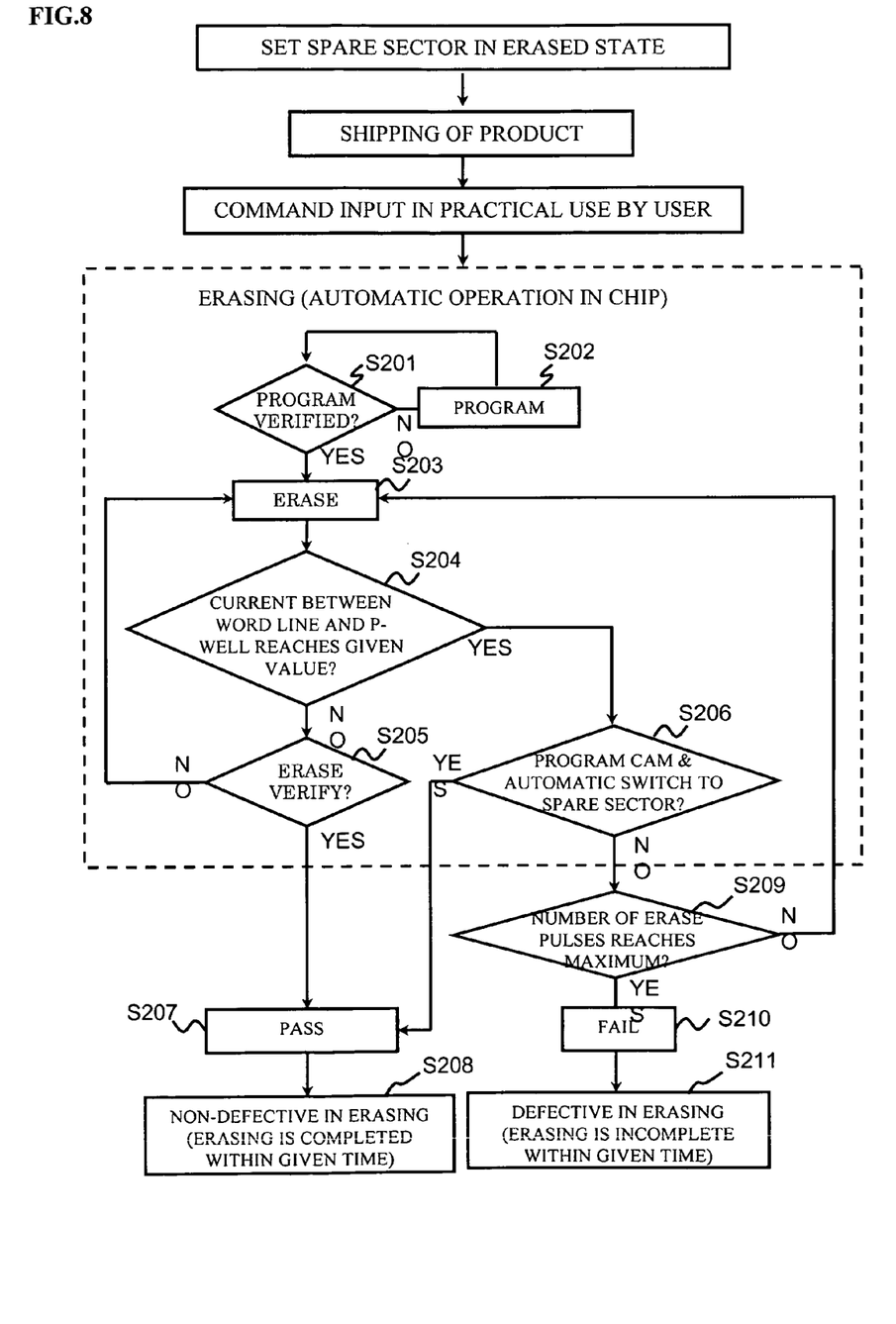
FIG. 8 is a flowchart of a second sequence of the long-erase failure recovery operation executed by the non-volatile semiconductor memory of the present invention.

FIG. 8 is a flowchart of a second sequence (second embodiment) of the automatic recovery from long-erase failure executable in the non-volatile semiconductor memory of the present invention. The second sequence is intended to recover the long-erase failure in the regular sectors, but is different from the first sequence in the method of detecting erase failure.

The present non-volatile semiconductor memory is equipped with a spare sector in the blank state that has been erased at the final text/inspection stage prior to shipping. When the erase command for erasing data in a regular sector is given by the user, the following operation responsive to the erase command is performed in the memory.

First, it is determined whether the regular sector is in the programmed state (step S201). If the regular sector is not in the programmed state (NO in step S201), data is written into the regular sector, which is thus in the programmed state (step S202).

When it is confirmed that the regular sector is in the programmed state (YES in step S201), the operation for erasing the program in the stored in the regular sector within the given time is carried out (step S203). A leakage current detection circuit, which is provided in the memory and will be described later, monitors the amount of current (the amount of current flowing between the word line and P-well) observed during the time when the erase pulse is being applied, and determines whether there is a leakage current (overcurrent) that does not occur in the normal erasing (step S204).

When it is determined that no overcurrent occurs (NO in step S204), it is determined in step S203 whether the regular sector is actually in the erased state (step S205). When the regular sector is in the erased state (YES in step S205), the erasing of the regular sector is completed (step S207), and the memory is maintained in the non-defective state (step S208).

When it is determined that the regular sector is not in the erased state (NO in step S205), the process returns to the erasing of the present sector, which is subjected to erasing again.

If the occurrence of an overcurrent is acknowledged (YES in step S204), the regular sector is determined to have long-erase failure in which the normal erasing cannot be performed, and is replaced by the spare sector. More particularly, the automatic redundancy CAM built in the memory is programmed with the "defective sector address" that is the address of the regular sector having the long-erase failure, and the defective regular sector is automatically replaced by the spare sector in the blank state (step S206).

When the automatic replacement with the spare sector is completed (YES in step S206), the erasing is completed (step S207) and the memory is maintained in the non-defective state (step S208).

In contrast, if the automatic replacement with the spare sector is incomplete due to a situation such that no spare sector in the blank state is available (NO in step S206), it is determined that the number of erase pulses has reached the maximum number (step S209). If the number of erase pulses has reached the maximum number (YES in step S209), the erasing of the sector is no longer completed (step S210), and the memory is determined to have the long-erase failure (step S211). If the number of erase pulses has not yet reached the maximum number (NO in step S209), the process returns to step S203 and the subsequent process is carried out. The reason why the maximum number of erase pulses is used in step S209 is the same as has been described previously in connection with step S109 in FIG. 1.

Figure 9:
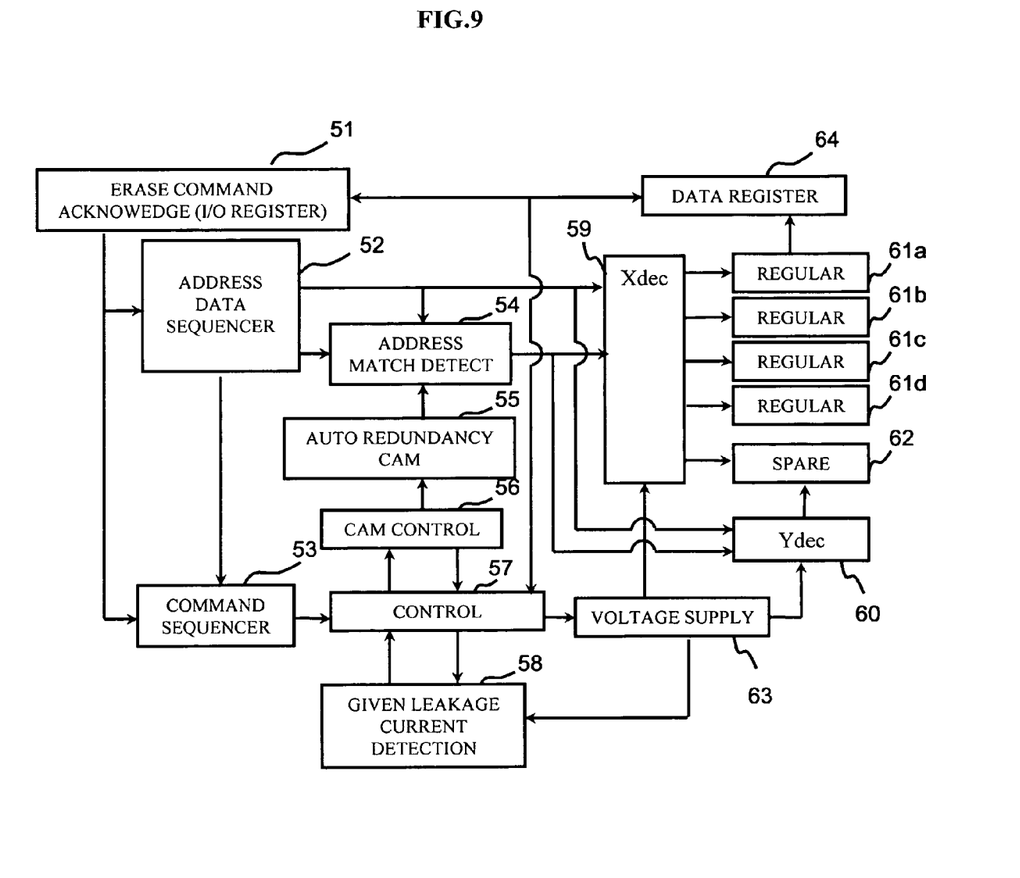
FIG. 9 is a block diagram of a second configuration of the automatic recovery section of the non-volatile semiconductor memory of the present invention that executes the sequence shown in FIG. 8.

FIG. 9 is a block diagram of an outline of a second configuration of the automatic recovery section of the non-volatile semiconductor memory of the present invention, the second configuration executing the sequence shown in FIG. 8.

The memory is equipped with a given leakage current detection circuit 58, a CAM control circuit 56, and a control circuit 57. The circuit 58 detects, for replacement with the spare sector, overcurrent flowing between the word line and the P-well due to the long-erase failure in which the erasing thereof is not completed within the given time is detected and this defective regular sector. The CAM control circuit 56 controls an automatic redundancy CAM 55. The control circuit 57 generates signals used to control the CAM control circuit 56 and switch to the spare sector on the basis of a leakage current detection signal output from the given leakage current detection circuit 58.

The erase command input by the user is acknowledged by an erase command acknowledgement unit 51 composed of an I/O register and a buffer. The address command signal that is included in the erase command and is indicative of a sector to be erased is output to an address data/sequencer 52, and the erase command signal included in the erase command is output to a command sequencer 53.

An address match detection circuit 54 makes a decision as to whether address data about the sector to be erased in the address data/sequencer 52 and the address data about the defective sector stored in the automatic redundancy CAM 55 programmed with the address of the defective sector match each other. If the address of the regular sector specified by the erase command coincides with the address of the sector having the long-erase failure, the address match detection circuit 54 cancels selection of the specified regular sector and executes automatic switching to the spare sector.

The memory has regular sectors 61 and a spare sector 62 serving as a redundant sector. A word line is connected to control gates of cells in the same sector, and a bit line is connected to drains of the cells in the same column. The word lines and bit lines are connected to an X decoder (Xdec) 59 and a Y decoder (Ydec) 60.

The X decoder 59 selectively drives the word line (X decoder node) corresponding to the addresses given by the address data/sequencer 52 and the address match detection circuit 54 on the basis of a signal supplied from a voltage supply circuit 63. The X decoder 59 is equipped with a decoder for decoding the input address signals and a word line driver for applying a given voltage to the word lines. The Y decoder 60 selectively drives the bit line corresponding to the address from the address data/sequencer 52 and the address match detection circuit 54 on the basis of a signal supplied from the voltage supply circuit 63, and is equipped with a decoder for decoding the input address signals and a bit line driver for applying a given voltage to the bit lines.

The X decoder 59 is equipped with a decoder that decodes the input address signal and a driver that applies a given voltage to the X decoder nodes. The Y decoder 60 is equipped with a decoder that decodes the input address signal and a bit line driver that applies a given voltage to the bit lines.

The signal that indicates the state (erased/programmed state) of each sector is output to and stored in a data register 64, and is further fed back to the control circuit 57. Replacement of a regular sector judged as erase failure with the spare sector in the blank state is executed through the voltage supply circuit 63 driven by a control signal supplied from the control circuit 57.

The address data/sequencer 52 acknowledges the regular sector to be erased and stores its address data, which is output to the command sequencer 53.

The command sequencer 53 supplies the control circuit 57 with a signal for erasing the regular sector based on the erase command from the erase command acknowledgement unit 51 and the address data from the address data/sequencer 52.

The control circuit 57 outputs a program verify signal to the voltage supply circuit 63 in order to determine whether the regular sector to be erased is in the erased or programmed state. The voltage supply circuit 63 supplied with the program verify signal determines whether the regular sector is in the erased or programmed state through the X decoder 59 and the Y decoder 60.

The result of determining whether the regular sector is in the erased or programmed state is output to the data register 64. The control circuit 57 is supplied with the signal stored in the data register 64 if the regular sector is not in the programmed state, and writes data into the regular sector via the voltage supply circuit 63, so that the regular sector can be in the programmed state.

In contrast, when it is confirmed that the regular sector is in the programmed state, information indicative thereof is output to the control circuit 57 from the data register 64, the voltage supply circuit 63 outputs a signal for erasing the regular sector within the given time to the X decoder 59 and the Y decoder 60, so that erasing is executed.

The control circuit 57 supplies the voltage supply circuit 63 with a signal for monitoring the current flowing between the word line and the P-well during the time when the erase pulse is being applied. The leakage current detection circuit 58, which is one embodiment of the erase performance detection circuit, monitors the presence/absence of the overcurrent arising from the long-erase failure.

In the absence of the overcurrent between the word line and the P-well, the erased state of the regular sector involved in erasing is verified. When it is determined that the regular sector is in the erased state, the result of this determination is output to the control circuit 57. In this manner, the erasing is completed and the memory is determined to have no failure. In contrast, if the regular sector has not been erased, the voltage supply circuit 63 outputs the signal for erasing the involved sector within the given time. Responsive to the above signal, the X decoder 59 and the Y decoder 60 continuously perform the erasing. This operation is repetitively carried out.

If the control circuit 57 detects the overcurrent between the word line and the P-well, the sector is determined to be the long-erase failure, and the spare sector is substituted in the sequence described below.

The replacement of the regular sector by the spare sector is carried out as follows. The control circuit 57 that determines that the regular sector should be replaced by the spare sector supplies the CAM control circuit 56 with an instruction signal for storing "defective sector address" in the automatic redundancy CAM 55. In response to the instruction signal, the automatic redundancy CAM 55 is programmed with the defective sector address, and the result of programming is output to the address match detection circuit 54.

The address match detection circuit 54 determines whether the address of the regular sector to be erased stored in the address data/sequencer 52 and the defective sector address stored in the automatic redundancy CAM 55 match each other. If the address of the regular sector specified by the erase command matches the address of the defective sector of long-erase failure, the address match detection circuit 54 supplies the X decoder 59 and the Y decoder 60 with the signals for canceling selection of the regular sector and automatic switching to the spare sector. In this manner, the regular sector of the long-erase failure can be automatically replaced by the spare sector 62 in the blank state.

When the automatic replacement with the spare sector is completed, the process associated with the erase command is completed, and the memory is maintained in the non-defective state. In contrast, if the automatic replacement with the spare sector is incomplete due to, for example, a situation in which a spare sector in the blank state is not available, the memory fails to recover the defective sector and is judged as a defective memory of long-erase failure.

When the memory is designed to have a larger number of times of replacement, a larger number of spare sectors in the blank state is used, as in the case of the first embodiment.

A description will now be given of the structure and operation of the given leakage current detection circuit with which the present memory is equipped.

Figure 10:
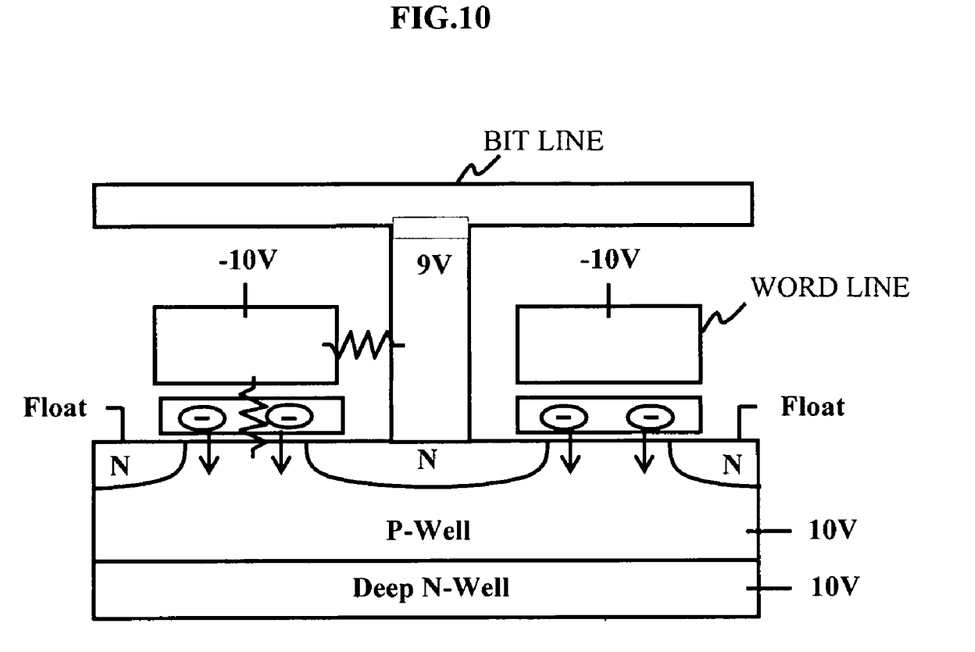
FIG. 10 is a cross-sectional view of a core of a memory cell during erasing.

FIG. 10 is a cross-sectional view of a core of a memory cell involved in erasing, the memory cell being a NOR type flash memory cell. In erasing, the word line and the P-well are respectively supplied with a negative voltage (−10 V) and a positive voltage (+10 V). Originally, there is no leakage current path between the word line and the P-well, and the potentials thereof are separately ensured. In contrast, in case where a leakage current path exists between the word line and the P-well, leakage current flows through the path and a voltage drop develops, and the original potentials thereof are no longer maintained. Therefore, there is a possibility that erasing is not sufficiently carried out and long-erase failure may occur. The present invention is intended to monitor the presence/absence of overcurrent and avoid the occurrence of long-erase failure.

Figure 11:
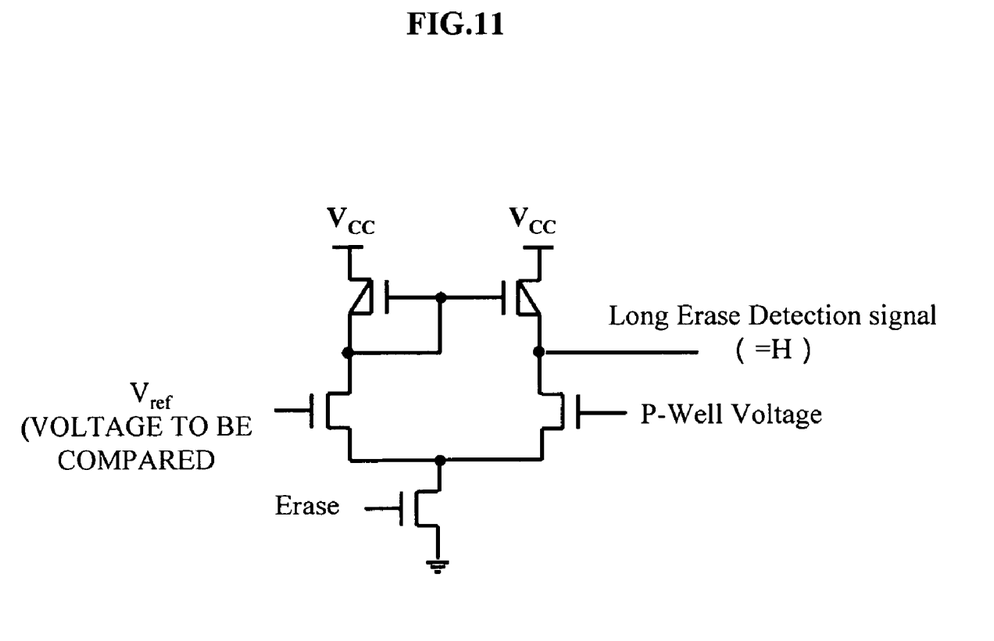
FIG. 11 is a diagram of a circuit configuration that monitors the amount of current flowing between a word line and a P-well and outputs a leakage current detection signal.

FIG. 11 is a circuit diagram of a configuration of the given leakage current detection circuit 58 that monitors the amount of current flowing between the word line and the P-well shown in FIG. 10 and outputs a long-erase detection signal, which is the leakage current detection signal. The circuit employs a current-mirror configuration, which detects a situation in which the P-well voltage becomes equal to or lower than a threshold voltage Vref that is a predetermined voltage to be compared and outputs the leakage current detection signal as the long-erase detection signal. The above detecting operation is carried out while a signal Erase is applied, in which the signal Erase is at the high level during the time when the voltage supply circuit 63 shown in FIG. 9 outputs the erase voltage.

As described above, the non-volatile semiconductor memory of the present invention is designed so that data in the spare sector or sectors are all erased and are set in the erased (blank) state in the final stage of the fabrication prior to shipping. Each time erasing is performed by the user, the current flowing between the word line supplied with the erase pulse and the P-well is monitored to determine whether overcurrent that does not flow in the normal erasing flows, and the spare sector is substituted for the regular sector before it is determined that the long-erase failure occurs in the memory.

Thus, there is no need to erase the spare sector again after automatic redundancy and the long-erase failure that occurs in user's practical use can be recovered. Even if a command of erasing the defective sector after automatic redundancy is supplied, this command directed to the defective sector is cancelled and the spare sector is instead selected based on the address matching between the sector address specified by the input command and the defective sector address. Thus, the switching to the spare sector can be automatically implemented.

Thus, the user feels as if long-erase failure in the regular sectors does not occur at all, and is provided with the normal environment in which erasing is normally completed. The spare sector or sectors are in the erased (blank) state at the time of shipping. Thus, the automatic redundancy with the spare sector does not need to erase the spare sector again after the replacement, and erasing can be completed quickly.

According to the present invention, a device and a method capable of automatically and quickly recovering long-erase failure in which data stored in the non-volatile memory cannot be erased within the given time. The non-volatile memory of the present invention is not limited to a flash memory or the like intended to primarily storing information but include a packaged device like a system LSI in which the non-volatile memory is embedded together with other functions.

What is claimed is:

1. A semiconductor device comprising:
   electrically erasable/programmable regular sectors;
   at least one electrically erasable/programmable spare sector for the regular sectors;
   a decoder selecting one of the regular sectors in response to an erase command;
   a monitor circuit monitoring an erase performance of a selected regular sector during erasing; and
   a control circuit automatically selecting the spare sector for the selected regular sector when the selected regular sector has a degraded erase performance,
   the spare sector being initially in an erased state prior to selecting by the control circuit.

2. The semiconductor device as claimed in claim 1, wherein the control circuit automatically selects the spare sector when the erase performance of the selected regular sector shows that erasing thereof is incomplete within a given period of time.

3. The semiconductor device as claimed in claim 1, wherein the monitor circuit comprises a pulse counter that counts pulses for erasing, and monitors the erase performance of the selected regular sector on the basis of a number of pulses counted.

4. The semiconductor device as claimed in claim 3, wherein the control circuit verifies erasing and automatically selects the spare sector when verification of erasing still fails at a given number of pulses counted.

5. The semiconductor device as claimed in claim 1, wherein the monitor circuit comprises a current detector that detects a leakage current flowing in the selected regular sector during erasing.

6. The semiconductor device as claimed in claim 5, wherein the control circuit automatically selects the spare sector when the leakage current reaches a given amount of current during erasing.

7. The semiconductor device as claimed in claim 5, wherein the leakage current is a current flowing between a word line and a well of the selected regular sector during erasing.

8. The semiconductor device as claimed in claim 1, wherein the control circuit comprises a content addressable memory (CAM) storing an address of the selected regular sector that has the degraded erase performance.

9. The semiconductor device as claimed in claim 1, wherein the control circuit comprises:
   a content addressable memory (CAM) storing an address of the selected regular sector that has the degraded erase performance; and
   an address compare circuit that compares an address indicated by the erase command with the address stored in the CAM and causes the decoder to select the spare sector when the address indicated by the erase command coincides with the address in the CAM.

10. The semiconductor device as claimed in claim 1, wherein the control circuit verifies erasing of the selected regular sector and generates a signal that sets the selected regular sector in a programmable state when verification passes.

11. The semiconductor device as claimed in claim 1, wherein the control circuit continues to verify erasing of the selected regular sector until a predetermined maximum number of pulses for erasing is applied thereto if the control circuit fails to automatically select the spare sector.

12. The semiconductor device as claimed in claim 1, wherein the spare sector has a configuration identical to that of the regular sectors.

13. The semiconductor device as claimed in claim 8, wherein the CAM includes a non-volatile memory cell that stores the address of the selected regular sector.

14. A redundant method for a non-volatile semiconductor memory comprising the steps of:
   erasing data stored in a regular sector selected by an erase command;
   monitoring an erase performance of a selected regular sector; and
   selecting a spare sector for the selected regular sector when the selected regular sector has a degraded erase performance,
   the spare sector being initially in an erased state prior to the step of selecting.

15. The redundant method as claimed in claim 14, wherein the step of selecting selects the spare sector when the erase performance of the selected regular sector shows that erasing thereof is incomplete within a given period of time.

16. The redundant method as claimed in claim 14, wherein the step of monitoring comprises a step of counting pulses for erasing in order to monitor the erase performance of the selected regular sector on the basis of a number of pulses counted.

17. The redundant method as claimed in claim 14, wherein the step of monitoring comprises a step of detecting a leakage current flowing in the selected regular sector during erasing.

18. The redundant method as claimed in claim 14, wherein the step of monitoring comprises a step of detecting a leakage current flowing between a word line and a well of the selected sector during erasing.

19. The redundant method as claimed in claim 14, further comprising a step of storing an address of the selected regular sector that has the degraded erase performance.

20. The redundant method as claimed in claim 14, further comprising the steps of:
   storing an address of the selected regular sector that has the degraded erase performance; and
   comparing an address indicated by the erase command with the address stored and selecting the spare sector when the address indicated by the erase command coincides with the address stored.

* * * * *